United States Patent
Inoue et al.

(10) Patent No.: US 7,134,181 B2
(45) Date of Patent: Nov. 14, 2006

(54) METHOD FOR PRODUCING $Nb_3Al$ SUPERCONDUCTIVE WIRE

(75) Inventors: Kiyoshi Inoue, Ibaraki (JP); Akihiro Kikuchi, Ibaraki (JP); Yasuo Iijima, Ibaraki (JP); Takao Takeuchi, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 143 days.

(21) Appl. No.: 10/513,857

(22) PCT Filed: Dec. 25, 2003

(86) PCT No.: PCT/JP03/16792

§ 371 (c)(1),
(2), (4) Date: Jan. 6, 2005

(87) PCT Pub. No.: WO2004/059666

PCT Pub. Date: Jul. 15, 2004

(65) Prior Publication Data

US 2005/0176587 A1  Aug. 11, 2005

(30) Foreign Application Priority Data

Dec. 25, 2002 (JP) .............................. 2002-374229

(51) Int. Cl.
*H01L 39/24* (2006.01)

(52) U.S. Cl. .............................. 29/599; 29/825; 148/98; 174/125.1; 505/432

(58) Field of Classification Search ............... 29/599, 29/825; 148/96, 98, 527; 174/125.1; 505/100, 505/230, 231, 430–434
See application file for complete search history.

(56) References Cited

U.S. PATENT DOCUMENTS

| 5,362,331 A * | 11/1994 | Tada et al. ..................... 29/599 |
| 5,501,746 A * | 3/1996 | Egawa et al. .................. 29/599 |
| 6,372,054 B1 * | 4/2002 | Kikuchi et al. ................ 148/98 |
| 6,376,099 B1 * | 4/2002 | Inoue et al. ................. 428/615 |
| 6,508,889 B1 * | 1/2003 | Kikuchi et al. ................ 29/599 |
| 6,699,821 B1 * | 3/2004 | Rudziak et al. ............. 505/430 |

FOREIGN PATENT DOCUMENTS

| JP | 62-278253 | 12/1987 |
| JP | 4-334822 | 11/1992 |

(Continued)

*Primary Examiner*—Minh Trinh
*Assistant Examiner*—Donghai D. Nguyen
(74) *Attorney, Agent, or Firm*—Wenderoth, Lind & Ponack, L.L.P.

(57) ABSTRACT

A superfine multi-core $Nb_3Al$ superconductive wire is produced by getting a $Nb_3Al$ superconductive wire ready which was obtained by subjecting a precursor wire having a superfine multi-core structure in which a plurality of Nb/Al complex cores are embedded in Nb, Ta, a Nb based dilute alloy, or a Ta based dilute alloy as the matrix to a rapid heating and quenching treatment comprising rapidly heating to a temperature range near 2,000° C. in 2 seconds, (A) coating the $Nb_3Al$ superconductive wire with Cu or Ag as the stabilizing material; then
(B) subjecting to a hot isostatic press (HIP) process for 10 minutes or more in a inert gas environment with a pressure of 40 atmospheres or more; and then
(C) subjecting heat treatment for 1–200 hours in temperature range of 680–850° C., to thereby obtain a method for producing $Nb_3Al$ superconductive wire and the $Nb_3Al$ superconductive wire obtained from said method in which: the cost is comparatively low; the wire may be produced to be either round or flat; and the superconductive characteristics is more stabilized.

7 Claims, 2 Drawing Sheets

FOREIGN PATENT DOCUMENTS

| | | |
|---|---|---|
| JP | 6-223647 | 8/1994 |
| JP | 6-283059 | 10/1994 |
| JP | 11-102617 | 4/1999 |
| JP | 2000-113748 * | 4/2000 |
| JP | 2000-195349 | 7/2000 |
| JP | 2001-52547 | 2/2001 |
| JP | 2002-33025 | 1/2002 |

* cited by examiner

METHOD FOR PRODUCING NB₃AL SUPERCONDUCTIVE WIRE

TECHNOLOGICAL FIELD

The invention of this application relates to a method for producing an Nb$_3$Al superconductive wire and the Nb$_3$Al superconductive wire obtained by said method. More specifically, the invention of this application relates to a method of producing an Nb$_3$Al superconductive wire which is of comparatively low cost, is capable of producing either as a round wire or as a flat wire in comparatively low cost, and is capable of more stabilizing the superconductive characteristics, and the Nb$_3$Al superconductive wire obtained by said method

BACKGROUND ART

The inventors of this invention have carried out diligent research on the various methods for producing superconductive wire. For Nb$_3$Al superconductive wire which has excellent magnetic field characteristics and which is excellent in warp resistance, the inventors have already been successful in producing a long superconductive wire having a superfine multi-core structure which is excellent in stability and alternating current characteristics, without losing the above-described characteristics of the wire (Japanese Patent No. 2021986).

However, generally when current flows through a superconductive wire, the current starts to flow from the surface of the wire and does not flow evenly. Therefore, there is the problem that the energy in the wire is released locally, and the superconductivity at that portion is destroyed to generating joule heat, and thus the destruction of the superconductive state spreads through the entire wire. This problem is particularly serious in the case of multi-core wires, and a complex of a stabilizing material for speeding up the cooling of the joule heat of the wire by bypassing the current at the portion where superconductivity has been destroyed, is necessary for practical use of the above-described Nb$_3$Al superconductive wire. Also, in order to more effectively act this stabilizing material, it is desirable that the electrical resistance and thermal resistance at the border of the stabilizing material and the matrix material are extremely low.

In addition, a metal that has low electrical resistance and large thermal conductivity such as Cu, Ag and the like is generally used as the stabilizing material of the Nb$_3$Al superconductive wire which is prepared by above-described the rapid heating and quenching and transformation method. The metal is complexed with a superconductive wire using (1) the Cu ion plating method (2) the internal Ag complex stabilization method or (3) the external Cu pressure contact complexing method.

In (1) Cu ion plating method, extremely thin Cu is disposed by the ion plating method on the Nb$_3$Al superconductive wire which is obtained by carrying out the rapid heating and quenching process, and a strong connection is formed between the matrix material and the Cu, and the resultant wire is stabilized by further disposing Cu of a desired thickness using a plating method. In this method a favorable interface between the matrix material and stabilizing material is obtained. On the other hand however, there are problems in that many processes have to be carried out, and the method is very costly because processing is done in a vacuum chamber.

(2) The internal Ag complex stabilization method is one in which matrix material and Ag which has low reactivity are incorporated into the Nb$_3$Al precursor as the stabilizing material. In this method, when Ag is subjected to the rapid heating and quenching process, it is necessary to support the Ag with matrix material so that the Ag wire does not break as a result of being exposed to a temperature in excess of the melting point. The Ag ratio cannot be too high and realistically the complex is prepared such that the Ag ratio is 0.4 or less. With this ratio, there is the problem that sufficient stability cannot be obtained for use as a superconductive wire. In addition, Ag is expensive and thus this method is costly. It is possible to use Cu whose melting point is high as the stabilizing material in this method, but because Cu reacts with the matrix material, there is the problem that it becomes necessary to deal with this.

n addition, (3) the external Cu pressure-contact complexing method is one in which the Nb$_3$Al superconductive wire which is obtained by carrying out the rapid heating and quenching process is covered with copper tape, and then the round wire is machined to be flat and thus cause wire section deformation between the Cu and Nb (matrix material) and is thus a method in which there is pressure-contact of the matrix material and the Cu. (Japanese Patent Laid-Open No. 2000-113748). This method has the advantages of being very inexpensive and at the portions where there is much wire section deformation, an excellent connection can be obtained at the interface of the matrix material and the Cu. However, the ratio of Cu which is used as the stabilizing material is limited to the range of about 0.3~0.6, and excellent connection is obtained for only about 60% of the entire interface and thus it is unsatisfactory in view of stability. The most notable disadvantage is that the superconductive wire is obtained as a flat wire, and it cannot be produced as a round wire for which demand is the highest.

As a result, the invention of this application was conceived in view of the above-described situation and solves the problems of the prior art by providing a method for producing Nb$_3$Al superconductive wire as well as the Nb$_3$Al superconductive wire obtained from said method in which: cost is comparatively low; both round and flat type wires can be produced; and superconductivity is more stable.

DISCLOSURE OF INVENTION

The invention of this application was conceived in view of the above-described situation, and it solves the problems of the prior art and provides the aspects described in the following.

That is to say, the first aspect of the invention of this application provides a method for producing a superfine multi-core Nb$_3$Al superconductive wire comprising the process of (A) coating a Nb$_3$Al superconductive wire with Cu or Ag as the stabilizing material; then (B) subjecting the Nb$_3$Al superconductive wire to a hot isostatic press (HIP) process for 10 minutes or more in a inert gas environment with a pressure of 40 atmospheres or more; and then (C) subjecting the Nb$_3$Al superconductive wire to heat treatment for 1–200 hours in temperature range of 680–850° C., wherein the Nb$_3$Al superconductive wire is obtained by subjecting a precursor wire having a superfine multi-core structure in which a plurality of Nb/Al complex cores are embedded in Nb, Ta, a Nb based dilute alloy, or a Ta based dilute alloy as the matrix to a rapid heating and quenching treatment comprising rapidly heating to a temperature range near 2,000° C. in 2 seconds.

In addition, a second aspect of the invention of this application is a method according the above method comprises the process of (D) subjecting the Nb$_3$Al superconductive wire to a cold working such that cross section reduction is 60% or more before or after process (B). A third aspect of the invention is one in which a hot isostatic press (HIP) process of the process (B) is carried out at 450° C. or higher in the case where Cu is coated as the stabilization material, and 380° C. or higher in the case where Ag is coated as the stabilization material. A fourth aspect of the invention is a method of production in which processes (B) and (C) are replaced by the process of (BC) (BC) subjecting the $Nb_3Al$ superconductive wire to a hot isostatic press (HIP) process for 1–200 hours in a 680–850° C. temperature environment and in an inert gas environment at a pressure of 40 atmospheres or more.

Furthermore, the sixth aspect of the invention of this application provides a method for producing a superfine multi-core $Nb_3Al$ superconductive wire comprising the process of, (C) subjecting a $Nb_3Al$ superconductive wire to heat treatment for 1–200 hours in temperature range of 680–850° C.; then (A) coated the $Nb_3Al$ superconductive wire with Al as the stabilizing material; and then (B) subjected the $Nb_3Al$ superconductive wire to a hot isostatic press (HIP) process for 10 minutes or more in the environment of a inert gas with a pressure of 40 or more atmospheres in a 230–500° C. temperature environment, wherein the $Nb_3Al$ superconductive wire is obtained by subjecting a precursor wire having a superfine multi-core structure in which a plurality of Nb/Al complex cores are emoedded in Nb, Ta, a Nb based dilute alloy, or a Ta based dilute alloy as the matrix to a rapid heating and quenching treatment comprising rapidly heating to a temperature range near 2,000° C. in 2 seconds.

In addition the seventh invention of this application provides an $Nb_3Al$ superfine multi-core superconductive wire material which is produced by any of the methods described above.

BEST MODE FOR CARRYING OUT THE INVENTION

Figure 1:
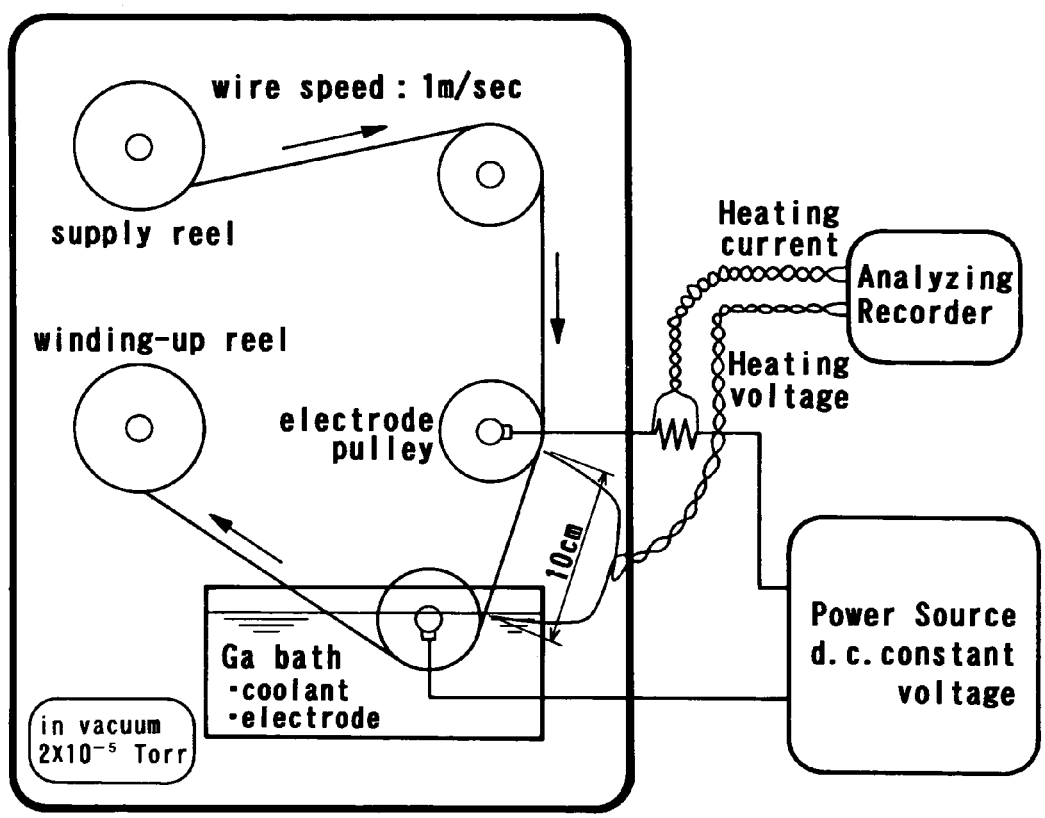
FIG. 1 is a conceptual diagram of an example of the rapid heating and quenching apparatus used for producing the $Nb_3Al$ superconductive wire of the invention of this application.

The invention of this application has the above-described features, and embodiments thereof are described in detail in the following.

The method for producing the $Nb_3Al$ superfine multi-core superconductive wire provided according to an aspect of the invention of this application comprising the process of, (A) coating a $Nb_3Al$ superconductive wire obtained by carrying out the rapid heating and quenching process with Cu or Ag as the stabilizing material; then (B) subjecting the $Nb_3Al$ superconductive wire to a hot isostatic press (HIP) process for 10 minutes or more in a inert gas environment with a pressure of 40 atmospheres or more; and then (C) subjecting the $Nb_3Al$ superconductive wire to heat treatment for 1–200 hours in temperature range of 680–850° C.

In an aspect of the invention of this application, the $Nb_3Al$ superfine multi-core superconductive wire is obtained by subjecting the precursor wire having a superfine multi-core structure which comprises filamentary Nb/Al complex core material and a matrix material to rapid heating at a temperature a range near 2000° C. for 2 seconds or less and then quenching to a temperature range below 400° C. at a speed of 2000° C./second or higher to thereby carry out the rapid heating and quenching process.

As for the Nb/Al complex core material of the precursor wire, it is desirable to have composition which forms a Nb/Al supersaturated solid solution, or more preferably a Nb-21-28 at % Al alloy, by the rapid heating and quenching process. Compositions other than that described above are not preferable because there is notable deterioration in the characteristics of the superconductive wire obtained. Furthermore, Nb/Al complex core material is preferably formed such that Al with a dimension of 1 μm or less is evenly dispersed in Nb since the characteristics of the superconductive wire obtained is improved. The Al configuration may be optional shape, such as a particle shape, a thread shape, and a thin film shape, and the dimension in these cases refer to the diameter, thickness and the like of the above configurations. Examples of methods for forming this type of Nb/Al complex core material include the rod-in-pipe method, the clad-chip-extrusion method, the jelly-roll method, the powder-in-pipe method and the like.

Nb, Ta, a Nb based dilute alloy, or a Ta based dilute alloy are selected as the matrix material in view of: excellent cold working characteristics for formation of the superfine multi-core structure; ability to maintain strength at the time of rapid heating near 2000° C.; and the fact that they do not affect the $Nb_3Al$ superconductive characteristics. It is to be noted that in the invention of this application, preferable examples of the base dilute alloy are those in which the amount of the alloy element is 3% or less of the individual element and 5% or less in total, and the amount of the Nb or the Ta in the alloy is 95% or more.

In addition, due to the rapid heating and quenching process, the Nb/Al complex core material is converted to the Nb-21-28 at % Al alloy filament (Nb/Al supersaturated solid solution). If the rapid heating is not carried out as described above, there is a dispersion reaction between the Nb/Al complex core material and the matrix, and thus this is not favorable. Furthermore, if the quenching is not carried out as described above, the Nb/Al supersaturated solid solution will not be formed, and an Nb/Al compound will be formed in the filament and thus the wire material will be fragile and this is not favorable. It is to be noted that in the invention of this application, a temperature near 2000° C. refers to the temperature range 1700–2100° C., and more strictly 1900–2100° C.

The above-described processes (A) to (C) to which the $Nb_3Al$ superconductive wire is subjected stabilize the $Nb_3Al$ superconductive wire and allow the interfacial connection of the stabilizing material and the matrix material to be favorably formed.

In the above-described process (A), Cu or Ag for stabilization is coated onto the $Nb_3Al$ superconductive wire. The coating means for the stabilizing material herein is not particularly limited. For example, the $Nb_3Al$ superconductive wire may be plated with Cu or Ag, or the $Nb_3Al$ superconductive wire may be inserted into an oxygen free copper pipe or a pure silver pipe. More specifically, it is preferable that the $Nb_3Al$ superconductive wire is plated with Cu or Ag to the end portion thereof or the whole $Nb_3Al$ superconductive wire is inserted into a Cu pipe or an Ag pipe, and both ends of the pipe are crushed and welded in a vacuum such that air (oxygen) cannot enter. The amount of the stabilizing material herein is set in a wide range accordance with the use of superconductive wire and the like. For example, in the case where the stabilizing material is Cu, the ratio may be freely set in the range which extends from the small Cu ratio of 0.1 or less to the large Cu ratio of 50 or more. In any case, it is important that wire formation is such that the entire $Nb_3Al$ superconductive wire is covered with a desired amount of stabilizing material. In the vacuum welding of the latter method above, it more preferable that there is no air between the $Nb_3Al$ superconductive wire and the stabilizing material because in the next process which is the hot isostatic press (HIP), the Cu pipe or the Ag pipe will be crushed and the connection interface will be favorable. Furthermore, although the reason is not clear, a favorable interface can be obtained if the Cu pipe includes oxygen as in the case of tough pitch copper.

In process (B), by carrying out hot isostatic press (HIP) processing for 10 minutes or more in the environment of a inert gas with a pressure of 40 atmospheres or more, favorable connection can be obtained at the stabilizing material/matrix material interface. If the pressure is less than 40 atmospheres, or if the time is less than 10 minutes, a favorable stabilizing material/matrix material interface cannot be obtained, and thus this is not preferable. The temperature for processing is preferably 450° C. or higher in the case where Cu is coated as the stabilizing material, and 380° C. or higher in the case where Ag is coated in order to obtain favorable connection.

In the process (C), the Nb-21-28 at % Al alloy filament is converted to the $Nb_3Al$ filament by carrying out heat treatment for 1–200 hours in a 680–850° C. temperature environment.

As a result, an $Nb_3Al$ superfine multi-core superconductive wire with a high stabilizing effect is produced. For example, if this $Nb_3Al$ superfine multi-core superconductive wire is covered with an insulation film and wound into a coil-like configuration by bending and the like, an $Nb_3Al$ superfine multi-core superconductive magnet having excellent superconductive characteristics can be obtained. It is to be noted that working for this insulation film and for the desired configuration may be carried out before process (B).

In addition, in the production method for the $Nb_3Al$ superfine multi-core superconductive wire provided in an aspect of the invention of this application, (D) which is cold working where reduction in cross section is 60% or more, is carried out before or after process (A). The $Nb_3Al$ superconductive wire which has been subjected to the rapid heating and quenching process has excellent formation processing characteristics with the matrix material and the Nb-21-28 at % Al alloy filament. Thus, mild cold working to cause cross-section reduction of 60% or less is carried out before or after the stabilizing agent is coated on, and as a result, the characteristics of the $Nb_3Al$ superfine multi-core superconductive wire are improved.

Also, in the method for producing the $Nb_3Al$ superfine multi-core superconductive wire provided in an aspect of the invention of this application, processes (B) and (C) may be replaced by (BC) in which a hot isostatic press (HIP) process is carried out for 1–200 hours in a 680–850° C. temperature environment in the presence of an inert gas at a pressure of 40 atmospheres or more, and thus process (B) and process (C) are carried out simultaneously.

Meanwhile, in the production method for the $Nb_3Al$ superfine multi-core superconductive wire provided in an aspect of the invention of this application, Al may be used as the stabilizing material. However, because the melting point of Al (660° C.) is lower than the heat treatment temperature for the transformation in process (C), disposing of the Al in the $Nb_3Al$ superfine multi-core superconductive wire must be done after process (C).

As a result, when Al is used as the stabilizing material, the method of the present invention comprising the process of, (C) subjecting a $Nb_3Al$ superconductive wire to heat treatment for 1–200 hours in temperature range of 680–850° C.; then (A) coated the $Nb_3Al$ superconductive wire with Al as the stabilizing material; and then (B) subjected the $Nb_3Al$ superconductive wire to a hot isostatic press (HIP) process for 10 minutes or more in the environment of a inert gas with a pressure of 40 or more atmospheres in a 230–500° C. temperature environment.

As is the case with the Cu and Ag described above, methods such as vacuum inclusion of the $Nb_3Al$ conductive wire in an Al pipe, or Al plating, Al conforming extrusion may be used as the method for coating of Al as the stabilizing material.

If the temperature for the HIP processing is less than 230° C., a favorable connection interface will not be formed, while if it exceeds 500° C. there will be a diffusion reaction between the Al and the matrix material, and a thick intermediate compound will be formed and thus this temperature range is not favorable.

This temperature range also makes it possible to obtain an $Nb_3Al$ superfine multi-core superconductive wire with excellent stability. Also, because the transmissivity of aluminum particles is high, the $Nb_3Al$ superfine multi-core superconductive wire which uses Al as the stabilizing material is also extremely useful as a superconductive magnet and the like for use in high energy physics research.

The most significant feature of the production method for the $Nb_3Al$ superfine multi-core superconductive wire of the invention of this application is that extremely favorable connections can be formed at the interface of the stabilizing material and the matrix material, and a superconductive wire with excellent stability can be obtained. Furthermore, this method is simple, and the cost is low compared to (1) the Cu ion plating and (2) the internal Ag complex stabilization method of the prior art. In addition, in this method, the amount of the stabilizing material can be set within a wide range, and Al can be used as the stabilization material. Also in the methods of the invention of this application, the cost is higher than that of (3) external Cu pressure contact complexing method, but the stability of the wire and is far more excellent in terms of the uses thereof. That is to say, when compared with the methods of producing the superconductive wire of the prior art, overall, the methods of the invention of this application can be said to be most excellent.

Working examples are illustrated in the following to describe the embodiments of this invention in more detail.

EXAMPLES

Example 1

Nb foil and Al foil are overlapped such that the thickness is 3:1 in at % and the wound into a roll, and then processed to be linear using extrusion processing and drawing (the jelly-roll method), and then the wire was cut at a desired length. 120 pieces of this wire were bundled together and packed into an Nb pipe, and a long precursor wire having a superfine multi-core structure in which 120 cores of the Nb/Al complex were embedded in an Nb matrix, were prepared using the extrusion and drawing processes.

This precursor wire was moved at a speed at 1 ml/s using the rapid heating and quenching device shown in FIG. 1, while heating to 2000° C. within 0.1 second by electrical heating, and then quenching by being passed through a Ga bath. At this point it was confirmed that the Nb/Al complex in the wire had converted to Nb—Al solid solution.

Next, the resulting wire was plated with Cu such that the copper ratio in the wire was (a) 0.4 and (b) 0.2, and drawing was done such that the cross-section reduction rate was about 5%. HIP processing was then carried out for 1 hour in an argon environment at 900 atmospheres and 600° C., and then transformation heat treatment was carried out for 10 hours at 800° C. in a vacuum, and the $Nb_3Al$ superfine multi-core superconductive wire was thereby obtained.

Figure 2:
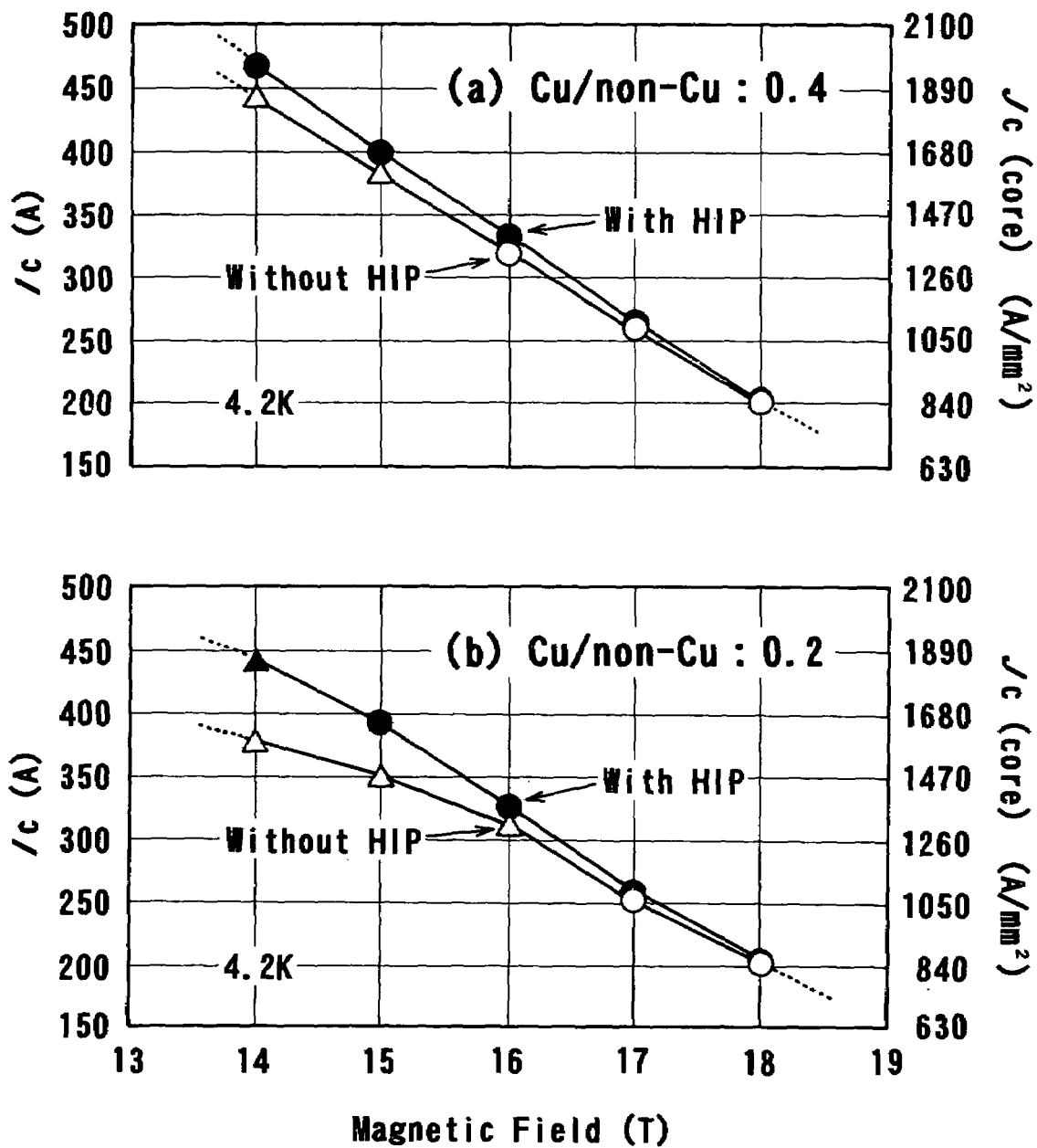
FIG. 2 shows graphs of the results of checking the superconductivity characteristics for 4.2K of the $Nb_3Al$ superfine multi-core superconductive wire in which the ratio of Cu as the stabilizing material is 0.4 in (a) and 0.2 in (b), and the solid black symbols show the case where the HIP processing is carried out, while the hollow symbols show the case where the HIP process is not carried out.

The superconductive characteristics of this superconductive wire were checked at 4.2K, and the results are shown in FIG. 2. Also, for the sake of comparison, a superconductive wire was made in the same manner except that the HIP process was not carried out, and the superconductive characteristics were checked and this is also shown in FIG. 2.

From FIG. 2, it can be seen that at high magnetic fields of 17 T or higher, when the critical current density Ic is small, whether or not the HIP process is carried out has little effect on the value of the critical current, but at low magnetic fields of 16 T or less the critical current density is greatly affected. Thus it was clear that apparent superconductive critical current density is larger when the HIP process was carried out. In other words, the superconductive wire produced using the methods of the invention of this application exhibit high stability even in the case where a large amount of superconductive current is passed through.

Also, when each of the superconductive wires are bent at 90°, observing the cross-section confirmed that the wire in which the HIP process was carried out had a strong connection, while the Cu and the matrix were stripped apart in the wire where the HIP process was not carried out.

By carrying out insulation coating of the wire in which the HIP process is done and winding it up in a solenoid configuration, an $Nb_3Al$ superconductive magnet is formed.

Example 2

The Nb/Nb-25 at % Al wire obtained by rapid heating and quenching as in Example 1 was covered with an oxygen-free copper pipe and drawing was done such that the copper and the wire mildly connected. The excess copper pipe at both ends of the wire was nipped with full force and crushed. The crushed portion was welded in a vacuum to thereby insert Nb/Nb-25 at % Al wire into a long copper pipe. The resulting wire was subjected to HIP processing for 1 hour in an argon environment of 900 atmospheres and 600° C., and then transformation heat treatment was carried out for 10 hours at 800° C. in a vacuum, and the $Nb_3Al$ superfine multi-core superconductive wire was thereby obtained.

Observing the cross section confirmed that the copper pipe which was subjected to the HIP process was crushed and copper was firmly connected to the Nb surface.

The superconductive characteristics of this superconductive wire as well as that of a superconductive wire which was made in the same manner without carrying out the HIP process were checked, and the same trend shown in FIG. 2 was seen and this confirmed that the HIP process is effective for stability of superconductive characteristics.

Example 3

The wire obtained by rapid heating and quenching as in Example 1 was plated with Cu and then the surface thereof was wrapped in alumina fiber to carry out thermally resistant insulation processing. The resultant wire was wound into a solenoid coil having an inner diameter of 20 mm, an outer diameter of 30 mm, and an overall turn number of 150. This solenoid coil was subjected to HIP processing for 10 hours in an argon gas environment at 900 atmospheres and 800° C., and it was confirmed that the Nb—Al supersaturated solid solution in the wire was converted to the $Nb_3Al$ phase. In addition, by observing the surface thereof it was confirmed that a strong connection was formed at the interface of Nb and Cu.

The critical current of this coil was almost the same as that of the short sample, and it was determined that a stable $Nb_3Al$ superconductive magnet was realized.

Furthermore, when the superconductive characteristics of this coil wire were checked, as was the case of the wire in Example 1, it was seen that both stability and superconductive characteristics were excellent. As a result, the transformation due to the HIP process improved stability without having any negative effects on the actual superconductive characteristics.

Example 4

The wire obtained by rapid heating and quenching as in Example 1 was crushed by a roll processing and thereby made flat. This flat wire was plated with Cu and the HIP process and heat transformation processing were carried out under the same conditions as Example 2 to thereby obtain $Nb_3Al$ superconductive wire. When the superconductive characteristics of this flat superconductive wire were checked, it was confirmed that the superconductive characteristics were the same as that of the round wire of Example 1.

As a result it was confirmed that due to the method of the invention of this application, superconductive characteristics are stable regardless of whether the wire is round or flat.

Example 5

The wire obtained by rapid heating and quenching as in Example 1 was plated with Cu and then the HIP process was carried out under various temperature, pressure and time conditions and then the thermal transformation was carried out under the same conditions as Example 1 to thereby obtain the $Nb_3Al$ superconductive wire.

The connection state at the Nb/Cu interface of these $Nb_3Al$ superconductive wire were checked and it was seen that the wires obtained with the HIP process when the temperature was less than 450° C., the pressure was less than 40 atmospheres and processing time was under 10 minutes, did not have favorable connection.

Example 6

The entire surface of the wire obtained by rapid heating and quenching as in Example 1 was silver plated such that the silver ratio is 0.2, and then mild drawing was done such that the cross section reduction rate was about 5%. Subsequently, HIP processing was carried out for 1 hour in an argon environment of 900 atmospheres and 600° C., and then transformation heat treatment was carried out for 10 hours at 800° C. in a vacuum, and the Nb$_3$Al superconductive wire was thereby obtained.

When the superconductive characteristics of this superconductive wire was checked, it showed the same characteristics as the wire of Example 1 (b) where the Cu ratio was 0.2. That is to say, a superconductive wire with favorable stabilization effect was obtained.

Example 7

Silver plating was done such that the silver ratio was 0.2 as in Example 6 and then drawing was done such that the cross section reduction rate was about 5%. The resulting wire was subjected to the HIP process under various conditions of temperature pressure and time, and then the thermal deformation is carried out under the same conditions as in Example 6 to thereby obtain the Nb$_3$Al superconductive wire.

The connection state at the Nb/Ag interface of these Nb$_3$Al superconductive wires were checked and it was found that the wires obtained with the HIP process in which the temperature was less than 280° C., pressure of less than 40 atmospheres and processing time was under 10 minutes did not have favorable connection. In addition, interface stripping was observed for the wires that did not have favorable connection when they were bent at 90°.

Example 8

The wire obtained by rapid heating and quenching as in Example 1 was subjected to transformation heat treatment for 10 hours at 800° C. in a vacuum, and then covered in an Al pipe and subjected to mild drawing. The ends of the aluminum pipe were crushed with full force and welded in a vacuum to thereby form a wire which has been inserted into a long Al pipe. Next the resulting wire was subjected to HIP processing in argon gas at 900 atmospheres and 400° C., and the Nb$_3$Al superconductive wire was thereby obtained.

The Al/Nb interface of the Nb$_3$Al superconductive wire obtained was observed and it was found that no notable diffusion layer was formed, and the interface was thus favorable.

In addition when the superconductive characteristics of resulting wire and the wire which was not subjected to the HIP process were compared under conditions where the critical current value was large, it was seen that this wire which was subjected to HIP process had a higher apparent critical current value and the stability was improved.

Comparative Example 1

Nb$_3$Al superconductive wire having Al inserted which was formed by the same method as that of Example 8 was subjected to HIP processing for 30 minutes in argon gas at 900 atmospheres and 550° C., and an Nb$_3$Al superconductive wire was thereby obtained.

When the cross section of this superconductive wire was observed, it was seen that Nb$_3$Al compound with a thickness of about 20 μm was formed at the interface of the Nb matrix and the Al. This was probably because the HIP process temperature was too high when Al was used as the stabilizing material. Furthermore, when the superconductive characteristics were checked, it was found that the stability was lower than in the case of Example 8 because the Nb$_3$Al compound increases the electrical resistance and the thermal resistance between the Al and the matrix.

Comparative Example 2

Nb$_3$Al superconductive wire having Al inserted which was formed by the same method as that of Example 8 was subjected to HIP processing for 3 hours in argon gas at 900 atmospheres and 200° C., and the Nb$_3$Al superconductive wire was thereby obtained.

When the cross section of this superconductive wire was observed, it was seen that favorable interfacial connection between the Nb matrix and the Al was not formed because the temperature for the HIP process was too low. Also, when the conductivity was checked, it was found that the stability was lower than in the case of Example 8.

The present invention is naturally not to be limited by the above examples and it is needless to say that various modifications of the details thereof are possible.

INDUSTRIAL APPLICABILITY

As described in detail above, according to this invention, a method for producing Nb$_3$Al superconductive wire and the Nb$_3$Al superconductive wire obtained from said method are provided in which: the cost is comparatively low; the wire may be produced to be either round or flat; and the superconductive characteristics are more stabilized.

The invention claimed is:

1. A method for producing a superfine multi-core Nb$_3$Al superconductive wire comprising the process of,
    (A) coating a Nb$_3$Al superconductive wire with Cu or Ag as the stabilizing material; then
    (B) subjecting the Nb$_3$Al superconductive wire to a hot isostatic press (HIP) process for 10 minutes or more in a inert gas environment with a pressure of 40 atmospheres or more; and then
    (C) subjecting the Nb$_3$Al superconductive wire to heat treatment for 1–200 hours in temperature range of 680–850° C.,
wherein the Nb$_3$Al superconductive wire is obtained by subjecting a precursor wire having a superfine multi-core structure in which a plurality of Nb/Al complex cores are embedded in Nb, Ta, a Nb based dilute alloy, or a Ta based dilute alloy as the matrix to a rapid heating and quenching treatment comprising rapidly heating to a temperature range near 2,000° C. in 2 seconds.

2. The method for producing the superfine multi-core Nb$_3$Al superconductive wire of claim 1, which comprises the process of
    (D) subjecting the Nb$_3$Al superconductive wire to a cold working such that cross section reduction is 60% or more before or after process (B).

3. The method for producing the superfine multi-core Nb$_3$Al superconductive wire of claim 1, wherein a hot isostatic press (HIP) process in process (B) is carried out at 450° C. or higher in the case where Cu is coated as the stabilization material, and at 380° C. or higher in the case where Ag is coated as the stabilization material.

4. The method for producing the superfine multi-core Nb$_3$Al superconductive wire of claim 1, wherein processes (B) and (C) are replaced by the process of,
    (BC) subjecting the Nb$_3$Al superconductive wire to a hot isostatic press (HIP) process for 1–200 hours in a 680–850° C. temperature environment and in an inert gas environment at a pressure of 40 atmospheres or more.

5. The method for producing the superfine multi-core Nb$_3$Al superconductive wire of claim 1, wherein process (C) is carried out before processes (A) and (B).

6. A method for producing a superfine multi-core $Nb_3Al$ superconductive wire comprising the process of, subjecting a $Nb_3Al$ superconductive wire to heat treatment for 1–200 hours in temperature range of 680–850° C.; then coated the $Nb_3Al$ superconductive wire with Al as the stabilizing material; and then subjected the $Nb_3Al$ superconductive wire to a hot isostatic press (HIP) process for 10 minutes or more in the environment of a inert gas with a pressure of 40 or more atmospheres in a 230–500° C. temperature environment, wherein the $Nb_3Al$ superconductive wire is obtained by subjecting a precursor wire having a superfine multi-core structure in which a plurality of Nb/Al complex cores are embedded in Nb, Ta, a Nb based dilute alloy, or a Ta based dilute alloy as the matrix to a rapid heating and quenching treatment comprising rapidly heating to a temperature range near 2,000° C. in 2 seconds.

7. The method for producing the superfine multi-core $Nb_3Al$ superconductive wire of claim 2, wherein a hot isostatic press (HIP) process in process (B) is carried out at 450° C. or higher in the case where Cu is coated as the stabilization material, and at 380° C. or higher in the case where Ag is coated as the stabilization material.

* * * * *